(12) United States Patent
Boyle

(10) Patent No.: US 6,210,752 B1
(45) Date of Patent: Apr. 3, 2001

(54) ALL-ALKOXIDE SYNTHESIS OF STRONTIUM-CONTAINING METAL OXIDES

(75) Inventor: Timothy J. Boyle, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 09/275,897

(22) Filed: Mar. 24, 1999

(51) Int. Cl.$^7$ ........................................... B05D 3/02
(52) U.S. Cl. ............................................... 427/226
(58) Field of Search .................................. 427/226

(56) References Cited

U.S. PATENT DOCUMENTS 5,039,654 * 8/1991 Mizuta et al. ..................... 427/226
5,645,634 * 7/1997 Ogi et al. ........................ 106/287.19
5,807,495 * 9/1998 Ogi et al. ........................ 252/62.9 PZ
5,811,153 * 9/1998 Hashimoto et al. ................. 427/58

* cited by examiner

Primary Examiner—Shrive Beck
Assistant Examiner—Michael Cleveland
(74) Attorney, Agent, or Firm—Elmer A. Klavetter

(57) ABSTRACT

A method for making strontium-containing metal-oxide ceramic thin films from a precursor liquid by mixing a strontium neo-pentoxide dissolved in an amine solvent and at least one metal alkoxide dissolved in a solvent, said at least one metal alkoxide selected from the group consisting of alkoxides of calcium, barium, bismuth, cadmium, lead, titanium, tantalum, hafnium, tungsten, niobium, zirconium, yttrium, lanthanum, antimony, chromium and thallium, depositing a thin film of the precursor liquid on a substrate, and heating the thin film in the presence of oxygen at between 550 and 700° C.

10 Claims, 2 Drawing Sheets

ALL-ALKOXIDE SYNTHESIS OF STRONTIUM-CONTAINING METAL OXIDES

This invention was made with Government support under Contract No. DE-AC04-94AL85000 awarded by the United States Department of Energy. The Government has certain rights in the invention.

BACKGROUND OF THE INVENTION

The present application is generally directed to a method of making metal-oxide, ceramic materials using only alkoxide precursors and more particularly, to a method of making strontium-containing metal oxide ceramic materials using a strontium neo-pentoxide precursor.

Metal-oxide, ceramic thin film materials have been increasingly investigated for use in various electronic and electro-optical applications. Enhanced development of these metal-oxide, thin film materials, often ferroelectric in nature, is necessary to yield important advances in miniaturization of memory devices, higher capacity memory devices, true memory capacity, increased radiation hardness and very fast switching. However, formation of the desired metal-oxide thin films typically requires rather extreme temperature processing, which is not always conducive to integration with conventional silicon-wafer processing technologies. Typically, at higher temperatures, the stability of the underlying silicon wafer and structures thereon are disrupted and render the final device useless.

While both physical and chemical methods exist for the production of metal-oxide ceramic materials, chemical solution routes (i.e., sol-gel methods routes) to electroceramic thin films are advantageous due to the low processing temperatures required for conversion to the ceramic phase, the flexibility in altering the stoichiometry or inclusion of dopants, and the relatively inexpensive experimental setup required. Polymeric sol-gel processing differs from other chemical methods by the poly-condensation of molecular species within the liquid phase, which often results in the crystallization of complex oxides at significantly reduced temperatures. This is in contrast to many of the other chemical methods of preparation, such as metalorganic decomposition and oxalate or citrate salt decomposition methods.

Several sol-gel methods exist for production of some metal-oxide ceramic thin films but uniform solution routes that require lower processing temperatures are of continued interest. A method using only alkoxide precursors is preferred to produce a precursor solution for the production of ceramic oxide thin films (i.e., ferroelectric and perovskite thin films), in part because of the subsequent low processing temperatures. Another added benefit is that, by using an all alkoxide precursor solution, side reactions can be limited and reproducible, highly uniform, ceramic thin films can be produced. Metal alkoxides are known to be useful precursor compounds in producing high quality metal-oxide ceramic thin films. However, the chemical structural characteristics and properties of these precursor compounds are important in determining the ease of preparation, the processing parameters necessary to prepare the metal oxide thin films and the quality and properties of the resulting thin films.

Alkoxide routes for some metal-oxide ceramic thin films are not utilized due to the low solubility of commercially available precursors. One method to circumvent this problem is to modify these precursors. The methoxy ethanol (MeOEtOH) route reported by Frey et al. (Frey, M., and Payne, D., Chem. Mater., 1995, 7, 123–129) is one general method that produces high quality precursor solutions. However, the process of Frey et al. using MeOEtOH entails the complex synthesis and hazardous (teratogenic) nature of the MeOEtOH.

Nonaka et al. (U.S. Pat. No. 4,920,093, issued on Apr. 24, 1990) also describes an all-alkoxide route for forming metal oxide thin films by a sol-gel method, specifically for forming a thin film system of copper and a rare earth metal with barium, strontium, and calcium, together with a compound that has hydrolysis inhibitory action. Nonaka et al., noting problems in obtaining thin films having a homogeneous composition, uses alkoxides and alkyoxyalkoxides dissolved in alcohols to form adequate thin films.

Boyle (U.S. Pat. No. 5,683,614, issued on Nov. 4, 1997) describes a sol-gel synthesis of bismuth-strontium-tantalum oxide; however, only the tantalum precursor compound is an alkoxide (an ethoxide) with bismuth acetate and strontium acetate precursor compounds required to achieve sufficient solubility for the described process.

Paz de Araujo et al. (U.S. Pat. No. 5,468,679, issued on Nov. 21, 1995) describes a multi-step, sol-gel process for fabricating ferroelectric materials, including strontium-containing metal-oxides, as layered superlattices by using a precursor comprising a titanium 2-methoxyethoxide in a solvent. de Araujo et al. note that short-chain metal alkoxides, such as ethoxides and propoxides, usually hydrolyze too readily to permit convenient handling and long term storage and longer chain metal ligands may not be soluble in water or may contain too much organic material to produce high quality films. They therefore conclude that only metal alkoxides with intermediate length ligands, such as 2-methoxyethoxides, are suitable for precursor solutions that can produce thin films of high quality. de Araujo et al. also teach that the precursor solution to the metal-oxides can contain metal moieties from a group of strontium, calcium, barium, bismuth, cadmium, lead, titanium, tantalum, hafnium, tungsten, niobium, zirconium, bismuth, scandium, yttrium, lanthanum, antimony, chromium, thallium, oxygen, chlorine, fluorine and mixtures thereof.

The present invention provides a method for producing strontium-containing metal-oxide, ceramic materials by using alkoxide precursors, including a strontium neo-pentoxide precursor, that can be used to produce metal oxide ceramic thin films quickly and at low temperatures.

SUMMARY OF THE INVENTION

According to the present invention, a method is provided of making a strontium-containing, metal-oxide ceramic thin film on a substrate comprising the steps of forming a precursor liquid by mixing a strontium alkoxide dissolved in a solvent and at least one metal alkoxide dissolved in a solvent, said at least one metal alkoxide selected from the group consisting of alkoxides of calcium, barium, bismuth, cadmium, lead, titanium, tantalum, hafnium, tungsten, niobium, zirconium, yttrium, lanthanum, antimony, chromium and thallium; depositing a thin film of said precursor liquid on a substrate; and heating said thin film in the presence of oxygen to make a strontium-containing, metal-oxide ceramic thin film. The strontium alkoxide is a novel strontium neo-pentoxide, $Sr_5(O)[OCH_2C(CH_3)_3]_8$(solvent)$_5$, said solvent being selected from a group consisting of Lewis basic solvents, preferably an amine solvent such as pyridine and a furan solvent such as tetrahydrofuran.

One metal-oxide ceramic thin film prepared was a barium-strontium-titanium precursor solution spin-cast deposited on a Si/SiO$_2$/Pt substrate and heated to approximately 550–700° C. Multiple layers can be formed by the method of the present invention. Another metal-oxide ceramic thin film prepared was a bismuth-strontium-tantalum precursor spin-cast deposited on a substrate and heated to form the ceramic thin film. The strontium alkoxide was selected from the group consisting of $Sr_5(O)(OCH_2C(CH_3)_3)_8(C_4H_8O)_4(HOCH_2C(CH_3)_3)$ or $Sr_5(O)(OCH_2C(CH_3)_3)_8(C_5H_5N)_4(HOCH_2C(CH_3)_3)$, the bismuth alkoxide was $Bi(OR)_3$, where R is selected from the group $OC_6H_3((CH(CH_3)_2)_2$, $OC_6H_3(CH_3)_2$, or $OCH_2C(CH_3)_3$, and the tantalum alkoxide was selected from the group consisting of $Ta(OC_2H_5)_5$, $Ta(OC_2H_5)(ONp)_4$, and $Ta(OCH_2C(CH_3)_3)_5$.

DETAILED DESCRIPTION OF THE INVENTION

The present invention provides a quick, reliable, and low-temperature method of making metal-oxide, ceramic thin films. According to the present invention, a method is described for making ceramic thin films using only alkoxide precursors. To generate a uniform, low-processing-temperature, all-alkoxide solution route to metal-oxide ceramic materials, alkoxide precursors are required which have high solubility and that limit oligomerization. Metal alkoxides with more sterically hindering pendant hydrocarbon chains were investigated. It is known in the art that with larger pendant chains, the likelihood that oligomerization will occur is decreased. Thus the solubility of the precursor is increased. However, the size of the hydrocarbon chain must be limited in order to preserve the lower processing temperatures.

According to the present invention, new precursor alkoxide compounds employing the neo-pentoxide [ONp=$OCH_2C(CH_3)_3$] ligand are used in the preparation of metal-oxide thin films. The ONp ligand is attractive for thin film materials applications for two reasons: (i) the presence of β-hydrogens which upon exposure to ambient humidity allow for "cross-linking" decomposition pathways to occur resulting in uniform films and (ii) the t-butyl moiety which due to the steric hindrance minimizes oligomerization and increases the solubility of the modified species.

In the method of the present invention, metal-oxide ceramic thin films are prepared from liquid precursor solutions by mixing a strontium alkoxide dissolved in a solvent and at least one additional metal alkoxide dissolved in a solvent. The metal alkoxides other than the strontium alkoxide are selected from the group consisting of alkoxides of calcium, barium, bismuth, cadmium, lead, titanium, tantalum, hafnium, tungsten, niobium, zirconium, yttrium, lanthanum, antimony, chromium and thallium. If the metal compound includes bismuth, lead, thallium or antimony, the precursor solution comprises an excess of such metal.

The solvated alkoxides are mixed together to form a precursor solution, preferably clear. Generally less than approximately 5 minutes is required to obtain the precursor solution. Thin films are prepared by coating the precursor solution on a substrate, such as a metal or quartz substrate and more preferably a $Si/SiO_2/Pt$ substrate, using standard coating methods and preferably using spin-cast deposition. The thin films are heated, or sintered, at temperatures from approximately 550–700° C. under oxygen-rich conditions to generate metal-oxide ceramic thin films. Several coating and heating steps may be repeated to achieve thicker films with multiple layers.

Figure 1:
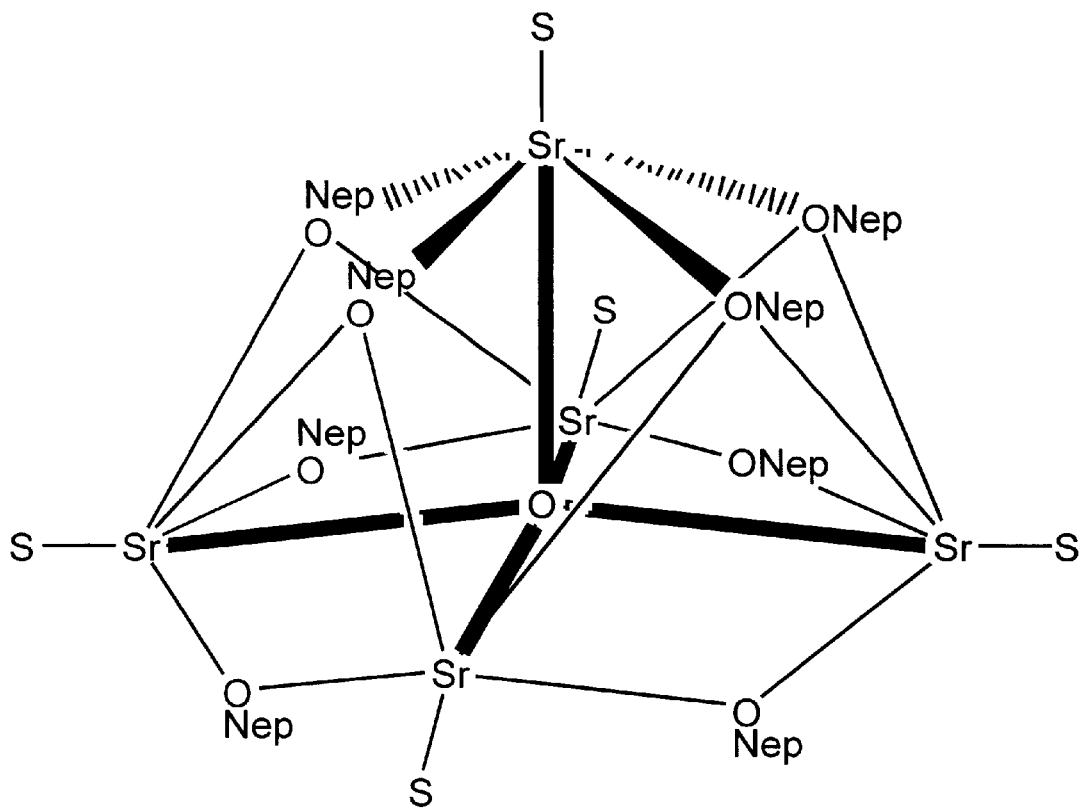
FIG. 1 is a representation of structure of the core of the strontium neo-pentoxide, $Sr_5(O)(OCH_2C(CH_3)_3)_8(solvent)_4(HOCH_2C(CH_3)_3)$.

Preferably, the strontium alkoxide is a strontium neo-pentoxide and is more preferably $Sr_5(O)(ONp)_8(solvent)_5$, where the solvent can be any Lewis basic solvent and preferably an amine solvent such as pyridine or a furan solvent such as tetrahydrofuran. This strontium neo-pentoxide compound was found to avoid carbonate formation whereas experiments using other alkoxides results in carbonate formation that yield subsequent thin films of significantly less uniformity and quality at higher processing temperatures. This strontium precursor is formed by reacting strontium metal with excess $HOCH_2C(CH_3)_3$ in the appropriate solvent under reflux conditions. The structure of the core of this strontium neo-pentoxide compound is shown in FIG. 1.

In one embodiment, the metal alkoxides are selected to yield a precursor solution system of barium-strontium-titanium and, in another embodiment, a bismuth-strontium-tantalum system. Recent interest in the ferroelectric/paraelectric material barium-strontium-titanium oxide, $(Ba,Sr)TiO_3$, stems from its high dielectric constant and linear dielectric response. As Sr cations are introduced into the ferroelectric $BaTiO_3$ perovskite structure, replacing the Ba cations, the Curie point (the actual temperature of the phase transition) linearly decreases. This allows for control over the Curie temperature of the final material. The ability to electrically modify the AC dielectric constant by application of a DC field enables integrated, tunable capacitors that are important for a variety of wireless communication applications. The cubic paraelectric phase of $(Ba,Sr)TiO_3$ displays reduced dielectric loss in comparison to BT (drops from 2% to <0.2%) and the reduction in ferroelectric hysteresis in capacitance-voltage (DC tuning) sweeps. These characteristics enable $(Ba,Sr)TiO_3$ to be used as a dielectric material with less hysteresis and electrical loss than that associated with other ferroelectric materials for such varied applications as capacitors, actuators, thermistor sensors, dynamic random access memories, phase shifters, tunable high Q-resonators, and tunable microwave filters. $SrBi_2Ta_2O_9$ has useful applications as a non-volatile electronic memory material.

In one embodiment according to the method of the present invention, $(Ba,Sr)TiO_3$ thin film materials, with Ba and Sr in a 1:1 ratio, are formed by mixing stoichiometric amounts of strontium and barium powder alkoxides in an amine solvent. The strontium precursor is $Sr_5(O)(ONp)_8(solvent)_5$ and the barium precursor is a barium alkoxide and preferably $Ba_4(ONp)_8(HONp)_6(Py)_2$, where Py is pyridine ($C_5H_5N$). Alcohol solvents are not used because of the formation of undesired carbonate phases due to the conversion of $CO_2$ that is present as a byproduct of the decomposition of alcohol solvents. Amine solvents, such as tetrahydrofuran (THF; $C_4H_8O$) and Py, are preferred because they are strong Lewis bases which bind to metal cations, reducing oligomerization and increasing solubility. The titanium alkoxide precursor, preferably $[Ti(ONp)_4]_2$, is solubilized in a solvent, preferably an alkane or aromatic solvent and more preferably toluene, and mixed with the solution containing the barium and strontium. Importantly, the metal alkoxide precursors used are monodentate (one binding site) and are used without modification, simplifying the method of production over other methods. This solution was mixed until clear, generally requiring less than approximately 5 minutes.

Thin films are produced from this solution using standard methods. Spin-cast deposition is preferred for production of uniform, defect free films. The standard substrate used for these studies was a Si/SiO$_2$//Pt substrate which had been cleaned with MeOH. The films were initially heated to approximately 100° C. to both volatilize the solvent and initiate organic decomposition that aids in stabilizing the resultant films. Higher temperatures were not chosen to avoid carbonate formation. Films were generated using standard spin-cast deposition methodologies (e.g., in air at 3000 rpm for 30 seconds) under ambient atmospheric conditions. After each layer was deposited, the film was heated to approximately 100° C. Films were removed after several minutes and placed into a preheated oven at the desired temperature (between approximately 550 to 700° C.), heated for at least 20 minutes under a flowing atmosphere of O$_2$, removed from the oven, and cooled to room temperature. Three to five layer films (approximately 3000 to 5000 Å) were generated in this manner. After addition of the final layer, films were placed into a single zone furnace, heated to a temperature between approximately 550 to 700° C. and held at temperature under an atmosphere of flowing O$_2$ for approximately 30 minutes.

In situ variable temperature grazing incidence X-ray diffraction (HT-GIXRD) measurements were undertaken on a 100° C. treated film to determine the film crystallization behavior. HT-GIXRD involves collecting the XRD pattern of the same sample at various temperatures. The HT-GIXRD indicates that each film crystallized around 650° C., as determined by the ingrowth of the 100 and 110 peaks. There was no evidence by HT-GIXRD of carbonate formation.

After synthesis and processing of the (Ba,Sr)TiO$_3$ films, 1000 Å top electrodes were deposited by shadow masked rf sputtering. Multi-layered films that were only sintered once displayed shorting problems; however, heat treating between each layer produced (Ba,Sr)TiO$_3$ films with acceptable top electrode yields. Films produced at 600° C. were lossy and showed poor properties, consistent with incomplete perovskite crystallization. For films fired at 700° C., however, reasonable properties were obtained. For a three layer film of approximately 0.3 $\mu$m in thickness, the dielectric constant at 10 kHz and 100 mV AC was found to be 120 (tan $\Theta$=0.03) and dielectric tunability of 29% at +/−10V DC.

Multi-dentate ligands have been shown to reduce the susceptibility of compounds to reactions with ambient humidity. Several polydentate chemical modifiers were added to reduce the number of terminal alkoxide ligands. After generating the standard precursor solution, 0.5 of an equivalent of modifier (based upon the titanium precursor) was dissolved in pyridine and added with stirring to the ternary solution. These modified films were found to be phase pure by XRD analysis. For a three layer film (approximately 0.3 $\mu$m in thickness) fired at 700° C., a dielectric constant of approximately 180 and a tan $\Theta$=0.01 with a tunability of 35% at +/−10 V were achieved.

In another embodiment of the present invention, SrBi$_2$Ta$_2$O$_9$ thin films were prepared. Sr$_5$(O)(ONp)$_8$(THF)$_4$(HONp) or Sr$_5$(O)(ONp)$_8$(Py)$_4$(HONp) and Bi(OR)$_3$ dissolved in an amine solvent, where R is OC$_6$H$_3$((CH(CH$_3$)$_2$)$_2$, OC$_6$H$_3$(CH$_3$)$_2$, or ONp are mixed with a tantalum alkoxide, and more preferably Ta(OC$_2$H$_5$)$_5$, Ta(OC$_2$H$_5$)(ONp)$_4$, or Ta(ONp)$_5$, dissolved in a solvent, preferably an alkane or aromatic solvent such as toluene. The solution was mixed until clear, generally requiring less than approximately 5 minutes to form the precursor solution. Thin films of SrBi$_2$Ta$_2$O$_9$ were prepared by spin-cast deposition and subsequent heating (sintering), as described in the previous embodiment.

EXAMPLE 1

Preparation of (Ba,Sr)TiO$_3$ Thin Films

Figure 2:
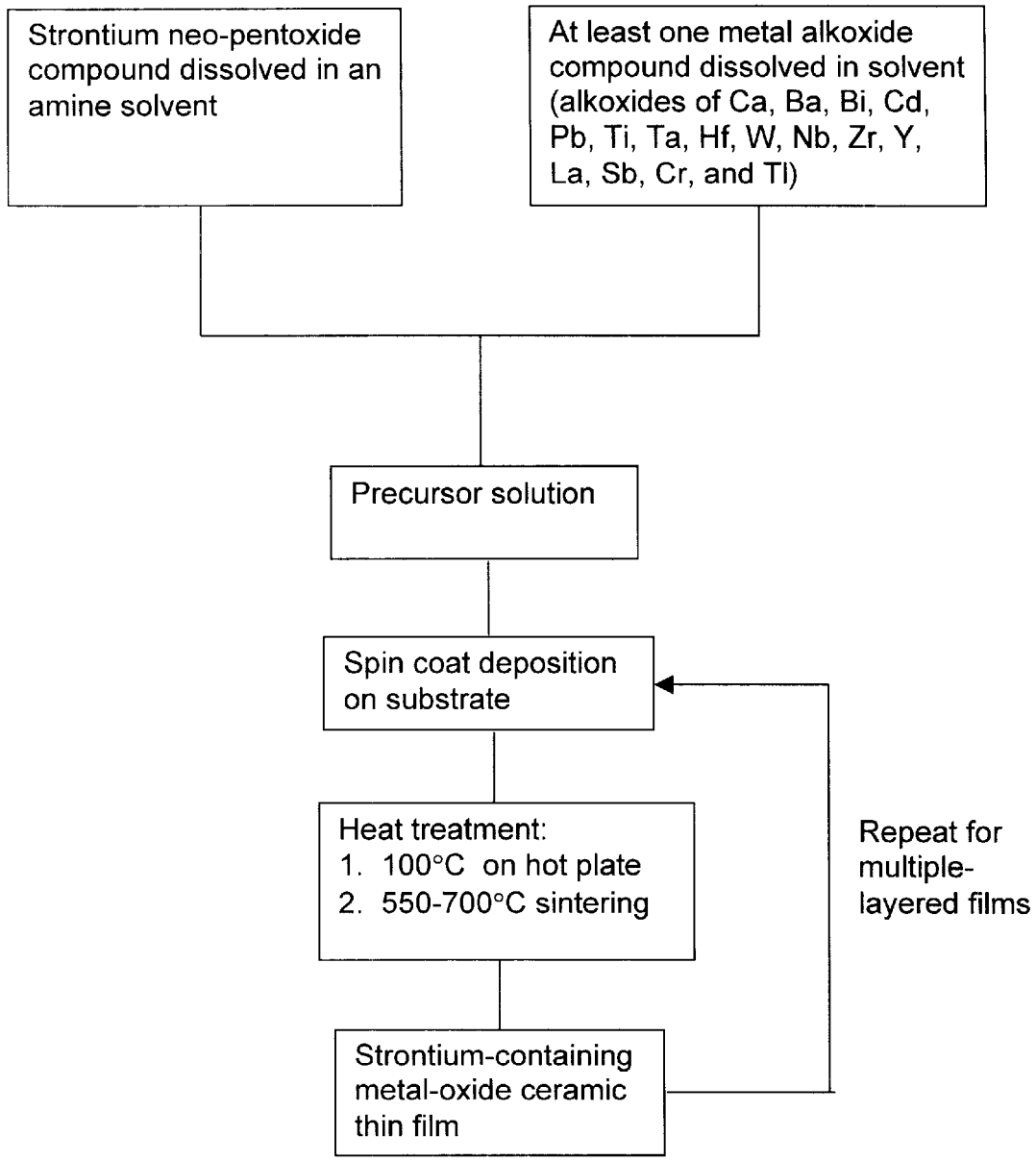
FIG. 2 is a schematic of the liquid route synthesis method.

Solution Preparation. Because each of the alkoxide components considered are generally soluble in standard organic solvents, hexanes, toluene, tetrahydrofuran and pyridine, were investigated. The synthesis of the precursor solution is schematically represented in FIG. 2.

The method to produce a 1:1 Ba:Sr (Ba,Sr)TiO$_3$ film yielded a clear solution and was as follows: (i) the stoichiometric mixture of the Sr and Ba powder precursors were dry mixed and then dissolved in the desired solvent, (ii) the Ti precursor was solubilized in a solvent (iii) the two solutions were mixed and stirred until clear, generally for less than approximately 5 minutes. 0.4 M concentrated solutions of hexanes, toluene, tetrahydrofuran, and pyridine were easily generated. Of these solvents, the pyridine and pyridine/toluene solvent mixtures yielded optically clear films. Analytical data of the precursor solution indicate that these are complex mixtures with rapidly exchanging ligands and multi-nuclear equilibria.

The standard substrate used for these studies was a Si/SiO$_2$//Pt substrate which had been cleaned with methanol. The films were heated using a hot-plate to approximately 100° C. to both volatilize the solvent and initiate organic decomposition which aids in stabilizing the resultant films. Films were generated from two solvent systems (pyridine and toluene/pyridine filtered through a 1 $\mu$m filter) using standard spin-cast deposition methodologies (in air or oxygen at approximately 3000 rpm for approximately 30 seconds) under ambient atmospheric conditions (relative humidity of approximately 24%). After each layer was deposited, the film was heated to approximately 100° C.). Films were removed after several minutes and placed into a preheated oven at the desired temperature (between approximately 600 to 700° C.), fired for at least 20 minutes under a flowing atmosphere of O$_2$, removed from the oven, and cooled to room temperature. Three to five layer films (~3000 to 5000 Å) were generated in this manner. Both the pyridine and toluene/pyridine solutions yielded smooth and continuous films. After addition of the final layer, films were placed into a single zone furnace, heated to a temperature of between 600 to 700° C., and held at temperature under an atmosphere of flowing O$_2$ for 30 minutes.

EXAMPLE 2

Preparation of SrBi$_2$Ta$_2$O$_9$ Thin Films

All-alkoxide SrBi$_2$Ta$_2$O$_9$ precursor solutions were generated by mixing of the appropriate precursors in the method shown in FIG. 2. The general scheme involves mixing the desired Bi(OR)$_3$ dissolved in pyridine with Sr$_5$(O)(ONp) (solvent)(HONp). In a separate vial Ta(OR)$_5$ was dissolved in toluene. The mixtures were combined forming a 0.4 M solution which was stirred for approximately 12 h. After this time, the solution was used for the production of thin films in a manner similar to that described in Example 1.

The invention being thus described, it will be apparent to those skilled in the art that the same may be varied in many ways. Such variations are not to be regarded as a departure from the spirit and scope of the invention, and all such modifications are intended to be included within the scope of the following claims.

We claim:

1. A method of making a strontium-containing, metal-oxide ceramic thin film on a substrate, consisting essentially of the steps of: forming a precursor liquid by mixing a strontium pentoxide compound dissolved in a solvent selected from the group consisting of pyridine and a furan solvent, said strontium pentoxide compound having the formula Sr$_5$(O)(OCH$_2$C(CH$_3$)$_3$)$_8$(solvent)$_5$, and at least one metal alkoxide dissolved in a solvent selected from the group consisting of pyridine and a furan solvent, said at least one metal alkoxide selected from the group consisting of alkoxides of calcium, barium, bismuth, cadmium, lead, titanium, tantalum, hafnium, tungsten, niobium, zirconium, yttrium, lanthanum, antimony, chromium and thallium; depositing a thin film of said precursor liquid on a substrate; and heating said thin film in the presence of oxygen to make a strontium-containing, metal-oxide ceramic thin film.

2. The method of claim 1 wherein said furan solvent is tetrahydrofuran.

3. The method of claim 1 wherein the substrate is $Si/SiO_2/Pt$.

4. The method of claim 1 wherein depositing a thin film is performed by spin-cast deposition.

5. The method of claim 1 wherein heating said thin film is at a temperature less than approximately 700° C.

6. The method of claim 1 wherein heating said thin film is at a temperature more than approximately 550° C.

7. The method of claim 1 further comprising the steps of repeatedly heating the thin film of said precursor liquid on a substrate to approximately 100° C. and depositing an additional thin film layer to form multiple layers.

8. The method of claim 1 wherein the strontium alkoxide is selected from the group consisting of $Sr_5(O)(OCH_2C(CH_3)_3)_8(C_4H_8O)_4(HOCH_2C(CH_3)_3)$ or $Sr_5(O)(OCH_2C(CH_3)_3)_8(C_5H_5N)_4(HOCH_2C(CH_3)_3)$ and the at least one metal alkoxide are a bismuth alkoxide and a tantalum alkoxide.

9. The method of claim 8 wherein the bismuth alkoxide is $Bi(OR)_3$, where R is selected from the group $OC_6H_3((CH(CH_3)_2)_2$, $OC_6H_3(CH_3)_2$, or $OCH_2C(CH_3)_3$.

10. The method of claim 9 wherein the tantalum alkoxide is selected from the group consisting of $Ta(OC_2H_5)_5$, $Ta(OC_2H_5)(ONp)_4$, and $Ta(OCH_2C(CH_3)_3)_5$.

* * * * *